United States Patent
Crescenzi, Jr.

(10) Patent No.: US 6,549,090 B2
(45) Date of Patent: Apr. 15, 2003

(54) INVERTED COPLANAR WAVEGUIDE COUPLER WITH INTEGRAL MICROSTRIP CONNECTION PORTS

(75) Inventor: Emil James Crescenzi, Jr., Cambria, CA (US)

(73) Assignee: Cree Microwave, Inc., Sunnyvale, CA (US)

( * ) Notice: Subject to any disclaimer, the term of this patent is extended or adjusted under 35 U.S.C. 154(b) by 0 days.

(21) Appl. No.: 09/910,311

(22) Filed: Jul. 19, 2001

(65) Prior Publication Data

US 2003/0016095 A1 Jan. 23, 2003

(51) Int. Cl.$^7$ ................................................ H01P 5/18
(52) U.S. Cl. ......................... 333/117; 333/246; 333/128
(58) Field of Search .............................. 333/116, 117, 333/238, 246, 25, 26

(56) References Cited

U.S. PATENT DOCUMENTS

| | | | |
|---|---|---|---|
| 4,482,873 A | 11/1984 | Nyhus | |
| 4,591,812 A | 5/1986 | Stegens et al. | |
| 4,675,620 A | 6/1987 | Fullerton | |
| 5,105,171 A | 4/1992 | Wen et al. | |
| 5,329,263 A | * 7/1994 | Minami | 333/116 |
| 5,446,425 A | * 8/1995 | Banba | 333/116 |
| 5,629,654 A | 5/1997 | Frick | |
| 6,204,736 B1 | * 3/2001 | Logothetis | 333/26 |
| 6,263,198 B1 | * 7/2001 | Li | 455/327 |
| 6,294,965 B1 | * 9/2001 | Merrill et al. | 333/26 |

OTHER PUBLICATIONS

Wen, Cheng P., "Coplanar–Waveguide Directional Couplers," *IEEE Transactions on Microwave Theory and Techniques*, vol. MIT–18, No. 6, pp. 318–322, Jun. 1970.

Ruis, E. et al., "A Broadband, High Directivity 3 DB Coupler Using Coplanar Waveguide Technology," *1995 IEEE MIT–S Digest*, pp. 671–674, 1995.

Engelbrecht, R.S. Et Al., "A Wide–Band Low Noise L–Band Balanced Transistor Amplifier," Proc. IEEE, 53, No. 3, Mar. 1965, pp. 237–247.

\* cited by examiner

*Primary Examiner*—Robert Pascal
*Assistant Examiner*—Dean Takaoka
(74) *Attorney, Agent, or Firm*—Townsend and Townsend and Crew LLP; Henry K. Woodward

(57) ABSTRACT

A coplanar coupler for use with microstrip input and output ports includes a printed circuit substrate in which first and second metal input ports are formed on a top surface and cooperate with a metal layer on the bottom surface as microstrip lines, and first and second metal output ports formed on the top surface which cooperate with the metal layer on the bottom surface as microstrip lines. The metal layer on the bottom surface functions as a ground plane for the input ports and the output ports, the metal layer being removed in a coupler region underlying at least portions of the metal input and output ports and extending therebetween. First and second metal lines are formed on the bottom surface in the coupler region and function as a coplanar coupler for the input and output ports. Electrical vias in the substrate interconnect the ports and the coplanar coupler.

15 Claims, 4 Drawing Sheets

US 6,549,090 B2

INVERTED COPLANAR WAVEGUIDE COUPLER WITH INTEGRAL MICROSTRIP CONNECTION PORTS

BACKGROUND OF THE INVENTION

This invention relates generally to microwave circuits, and more particularly the invention relates to signal couplers as used in microwave circuits. Microwave circuits often use signal couplers between circuit sections. Numerous coupling structures have been used in the past, including microstrip coupled lines, stripline coupled lines, and coplanar waveguide coupled lines. The most common form of microwave circuitry is microstrip transmission lines. Microstrip couplers, such as the Lange coupler, are difficult to manufacture in printed circuit boards which have limited and rather course resolution of lines and spaces. This is particularly true when one requires high coupling values on the order of −3 dB (i.e., one-half of the incident energy). It has been demonstrated previously that a coplanar waveguide coupler can satisfy the high value coupling while only requiring medium resolution of line widths and gaps. However, a coupler realized entirely in coplanar waveguide form requires microstrip-to-coplanar waveguide transitions which consume space and place restrictions on circuit design.

Frick U.S. Pat. No. 5,629,654 discloses a totally coplanar waveguide construction. However, for many applications it is desirable to have microstrip transmission line input and output ports. Prior art designs require separate microstrip-to-coplanar transitions in order to use a coplanar waveguide coupler with microstrip input and output ports. This adds complexity to circuit design and consumes additional circuit board space.

The present invention is directed to providing a coplanar waveguide coupler for microstrip input/output ports which is space efficient and compatible with printed circuit board manufacturing considerations while providing requisite coupling value, terminal return loss, and isolation.

BRIEF SUMMARY OF THE INVENTION

In accordance with the invention, a coplanar waveguide coupler for microstrip input and output ports in a microwave circuit is fabricated on a printed circuit substrate in which the microstrip input and output lines are on one surface of the substrate, and the coplanar waveguide coupler lines are on an opposite surface of the substrate with vias interconnecting the microstrip ports with the coplanar waveguide coupler lines.

A metal layer is formed on the surface with the coplanar coupler, but is spaced from the coupler. The metal layer functions with the input and output ports in forming the microstrip ground plane.

In a preferred embodiment, first and second metal lines of the coplanar coupler are in spaced parallel alignment, and preferably comprise U-shaped metal traces. A bias metal line can be placed on the surface with the input and output ports which extends across and spaced from the coplanar coupler lines on the opposing surface for providing bias voltage to circuit components mounted on the surface. By grounding the bias metal line, the coplanar coupler can include a partial grounded coplanar waveguide. The amount of the grounded coplanar waveguide center region can be adjusted to optimize the characteristics of the overall coupler.

The structure in accordance with the invention is efficient in substrate space which results in cost, manufacturing, and application enhancements. The invention and objects and features thereof will be more readily apparent from the following detailed description and appended claims when taken with the drawings.

DETAILED DESCRIPTION OF ILLUSTRATIVE EMBODIMENTS

Figure 1:
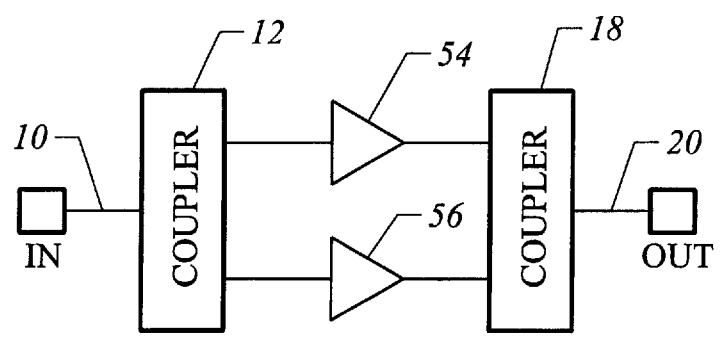
FIG. 1 is a functional block diagram of a quadrature balanced amplifier module in which couplers in accordance with the invention can be employed.

FIG. 1 is a functional block diagram of a microwave circuit in which an input signal at 10 is applied through a coupler 12 to quadrature balance amplifiers 54, 56 with the amplified outputs of the amplifiers applied through coupler 18 to an output 20. Typically, the input line 10 and output line 20 are microstrip comprising a metal trace on one surface of a substrate over a grounded metal layer on the opposing surface of the substrate, and couplers 12, 18 are coplanar metal traces. Frick U.S. Pat. No. 5,629,654 discloses input and output microstrip with coplanar coupler 12 all formed on one surface of the printed circuit of the substrate. As noted above, this arrangement is not cost or space effective.

Figure 2:
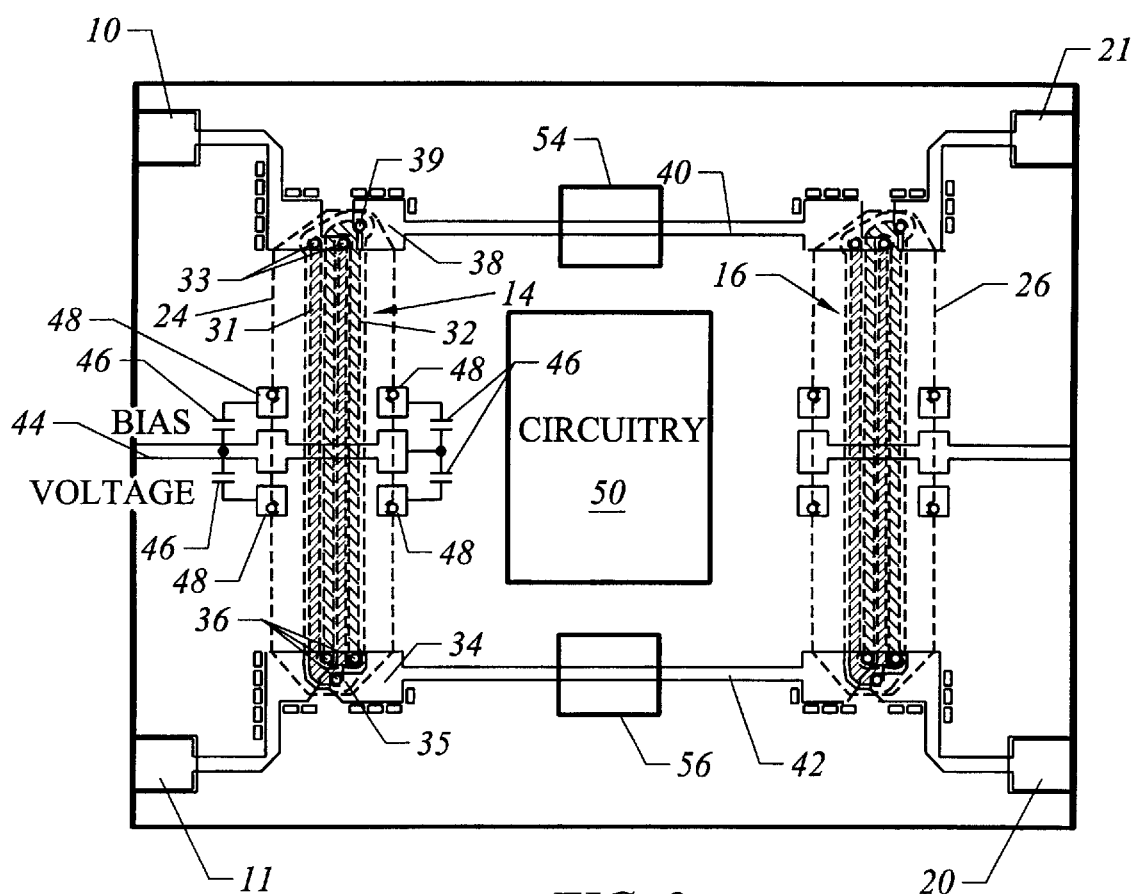
FIG. 2 is a top view illustrating metal traces on top and bottom surfaces of a printed circuit substrate for a coplanar coupler in accordance with one embodiment of the invention.

In accordance with the present invention, improved cost and performance are realized by placing the microstrip input and output lines on one surface of the substrate and placing the coplanar waveguide coupler lines on another surface of the substrate with the input and output lines connected to the coplanar waveguide coupler by feedthrough vias through the substrate. The substrate can be ceramic with gold, silver, or copper metal lines, or other suitable substrates and metal layers can be used. FIG. 2 is a plan view of the circuitry of FIG. 1 realized using a coplanar waveguide coupler in accordance with the present invention. In this view, all metal traces and circuitry are on the top surface of the substrate except for the couplers 14 and 16 which are on the bottom surface. Input port 10 and isolation port 11 comprise metalization on the top surface which cooperates with a metalized ground layer on the bottom surface to form a microstrip input line. Similarly, output port 20 and an isolation port 21 comprise metalization on the top surface which cooperates with the ground metalization on the bottom surface as a microstrip output line. The coplanar waveguide couplers 14, 16 comprise metalization on the bottom surface formed in areas 24, 26 where the backside metalization has been removed. Coplanar waveguide coupler 14 comprises interdigitated U-shaped metal traces 31, 32 with metal trace 31 connected by throughhole vias 33 to input metalization 10 and to metal trace 34 through via 35. Similarly, U-shaped metal trace 32 is connected to isolation port 11 through vias 36 and to microstrip trace 38 through via 39. Closely spaced parallel lines 31 and 32 form the coupled lines. Microstrip 34, 38 provide the balanced input to amplifiers 54, 56 with microstrip output 40, 42 connecting the outputs of amplifiers 54, 56 to coplanar waveguide coupler 16 on the bottom surface. Coupler 16 has similar structure as coupler 14 with the U-shaped metal traces on the bottom surface connected to microstrip 40 and 42, and to output port 20 and isolation port 21 by conductive vias through the substrate.

In accordance with a feature of the invention, a bias voltage (at RF ground) can be connected by microstrip 44 on the top surface over and spaced from coupler 14 on the bottom surface, providing a bias voltage to circuitry shown generally at 50. The bias voltage line 44 is coupled to the ground layer on the bottom surface through capacitors 46 and vias 48. The cross-over structure allows DC bias to be taken at right angles to the coplanar coupler lines and cross over the coupler lines without degrading the performance of the coplanar coupler while maintaining a high degree of electrical isolation between the coupler and the DC track. In another embodiment, the inverted coplanar coupler can have a center section under the DC bias cross-over which functions as a part grounded coplanar waveguide. By adjusting the amount of the grounded coplanar waveguide center section, the characteristics of the overall coupler can be optimized.

Figure 3A:
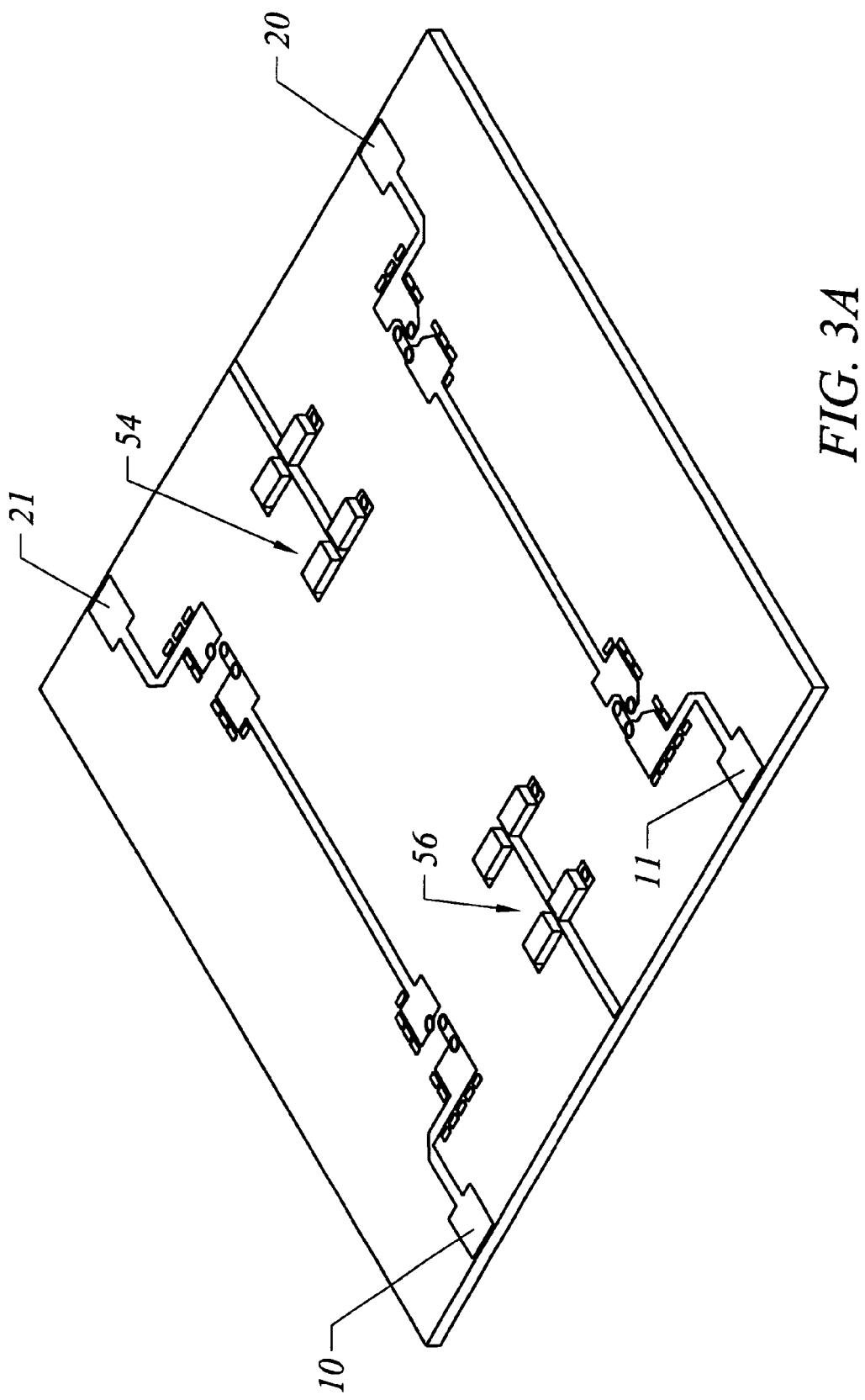
FIG. 3A is a plan view of metalization for the input and output ports on one surface of the structure of FIG. 2.
Figure 3B:
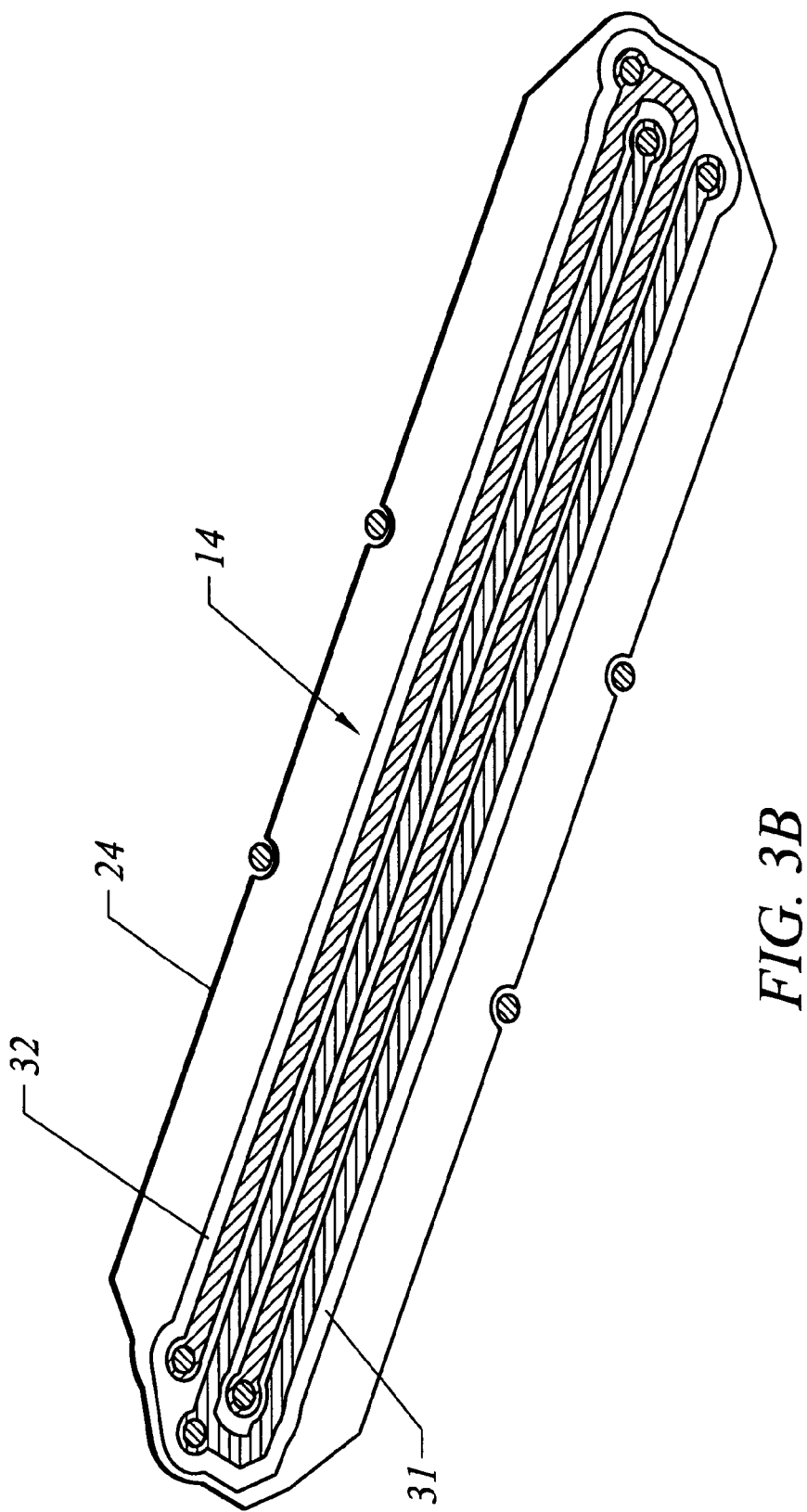
FIG. 3B is a plan view of metalization for the coplanar coupler on the bottom surface of the structure of FIG. 2.
Figure 4:
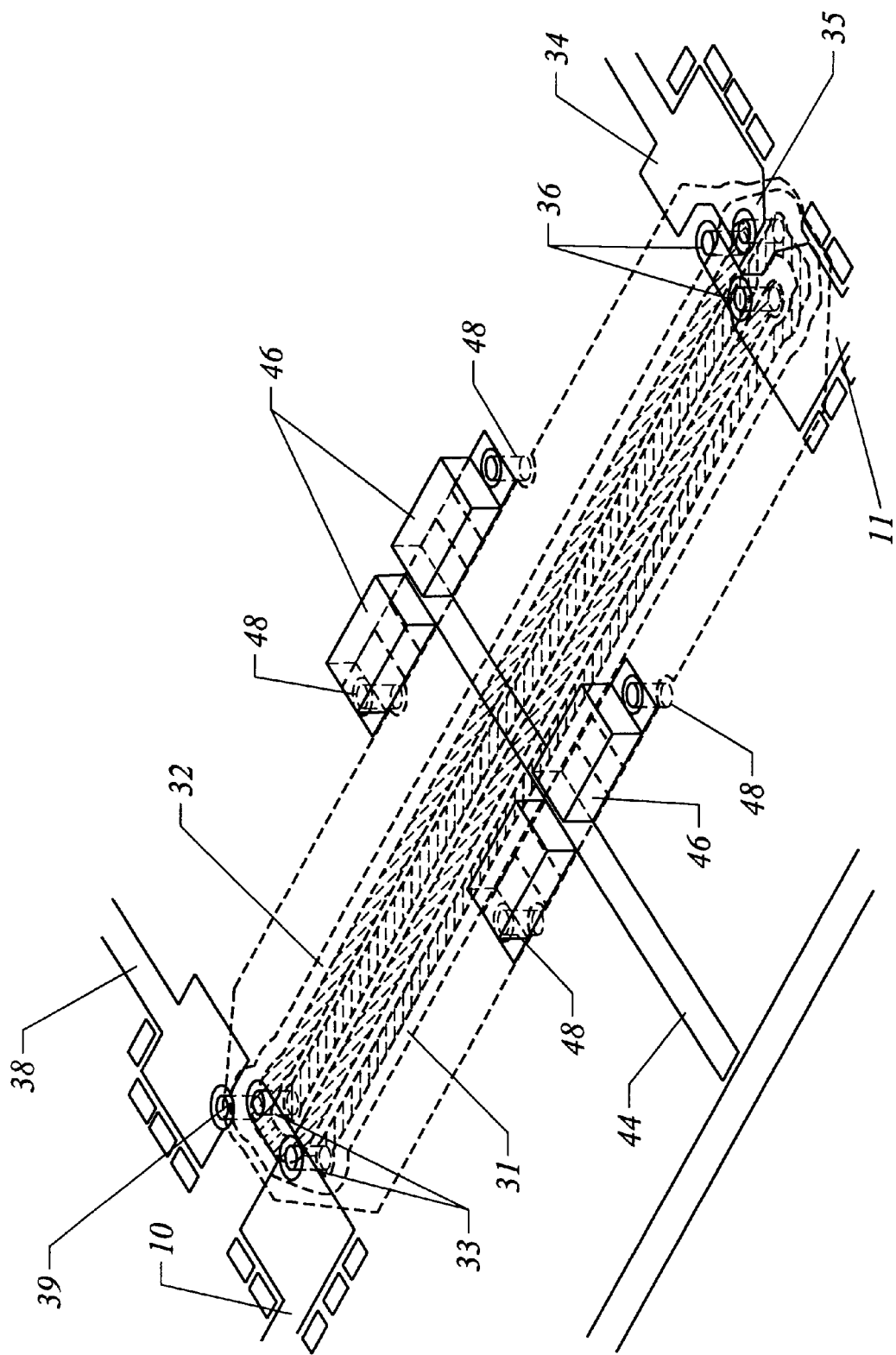
FIG. 4 is a three dimensional view of the metal traces on the top and bottom surfaces and the interconnecting vias.

FIG. 3A illustrates the metal traces on a portion of the top surface of the substrate including input port and microstrip 10, isolation port and microstrip 11, amplifiers 54, 56, the output microstrip port 20 and output isolation port 21. FIG. 3B is a plan view of the bottom surface showing the metal layer 50 with a removed portion 24 in which is formed the coplanar coupler 14. FIG. 4 shows a three dimensional view of representative vias 48 and their role in interconnecting the top microstrip trace to the bottom coplanar waveguide traces. For example, these same improved coplanar couplers can be combined with mixers and modulators to form quadrature-balanced mixers and modulators. A single improved coplanar coupler can be applied in conjunction with an in-phase divider/combiner to form IQ modulators and image reject mixers.

There has been described an improved coplanar coupler for use with microstrip input and output lines in a quadrature power division and amplification application. While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. In a microwave circuit having a coplanar waveguide coupler for microstrip input and output ports on a printed circuit substrate, the improvement comprising:
   a) placing microstrip input and output lines on one surface of the substrate,
   b) placing coplanar waveguide coupler lines and a ground conductor on another surface of the substrate, and
   c) interconnecting the microstrip input and output lines on the one surface to the coplanar waveguide coupler lines on another surface.

2. The improvement as defined by claim 1 wherein the step c) includes the use of feedthrough vias.

3. The improvement as defined by claim 2 wherein the coplanar waveguide coupler lines comprise first and second interdigitated U-shaped metal lines in spaced-parallel alignment.

4. The improvement as defined by claim 3 and further including the step of:
   d) providing a bias voltage metal line on the one surface extending across and spaced from the first and second metal lines of the coplanar coupler.

5. The improvement as defined by claim 1 and further including the step of:
   d) providing a bias voltage metal line on the one surface extending across and spaced from the first and second metal lines of the coplanar coupler.

6. A coplanar waveguide coupler for use with microstrip input and output ports comprising:
   a) a printed circuit substrate having top and bottom surfaces,
   b) first and second metal input ports formed on the top surface,
   c) first and second metal output ports formed on the top surface,
   d) a metal layer on the bottom surface functioning as a ground plane for the input ports and the output ports as microstrip, the metal layer being removed in a coplanar waveguide coupler region under at least portions of the metal input and output ports and extending therebetween,
   e) first and second interdigitated U-shaped metal lines on the bottom surface in the coupler region functioning as a coplanar waveguide coupler for the input port and output port, and
   f) electrical connectors connecting one input port and one output port to the first metal line and connecting the other input port and the other output port to the second metal line.

7. The coplanar waveguide coupler as defined by claim 6 and further including a bias voltage metal line on the top surface extending across and spaced from the first and second metal lines of the coplanar waveguide coupler.

8. The coplanar waveguide coupler as defined by claim 6 wherein the first and second metal lines are in spaced parallel arrangement.

9. The coplanar waveguide coupler as defined by claim 8 wherein the electrical connectors are feedthrough vias in the substrate.

10. The coplanar waveguide coupler as defined by claim 9 wherein the substrate is ceramic.

11. The coplanar waveguide coupler as defined by claim 10 wherein the metal is selected from the group consisting of gold, silver, and copper.

12. The coplanar waveguide coupler as defined by claim 11 and further including a bias voltage metal line on the top surface extending across and spaced from the first and second metal lines of the coplanar waveguide coupler.

13. The coplanar waveguide coupler as defined by claim 6 wherein the electrical connectors are feedthrough vias in the substrate.

14. The coplanar waveguide coupler as defined by claim 13 wherein the substrate is ceramic.

15. The coplanar waveguide coupler as defined by claim 14 wherein the metal is selected from the group consisting of gold, silver, and copper.

* * * * *